United States Patent
Oda

(10) Patent No.: US 9,621,159 B2
(45) Date of Patent: Apr. 11, 2017

(54) RECONFIGURABLE SEMICONDUCTOR INTEGRATED CIRCUIT AND ELECTRONIC DEVICE

(71) Applicant: KABUSHIKI KAISHA TOSHIBA, Tokyo (JP)

(72) Inventor: Masato Oda, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/848,022

(22) Filed: Sep. 8, 2015

(65) Prior Publication Data

US 2016/0086640 A1 Mar. 24, 2016

(30) Foreign Application Priority Data

Sep. 19, 2014 (JP) ................................ 2014-191763

(51) Int. Cl.
*G11C 7/22* (2006.01)
*H03K 19/00* (2006.01)
*H03K 19/177* (2006.01)

(52) U.S. Cl.
CPC ....... *H03K 19/00* (2013.01); *H03K 19/17748* (2013.01); *H03K 19/17756* (2013.01)

(58) Field of Classification Search
USPC ........................... 365/189.08, 189.14, 189.15
See application file for complete search history.

(56) References Cited

U.S. PATENT DOCUMENTS

| 7,193,437 | B2 | 3/2007 | Cappelli et al. |
| 7,295,037 | B2 | 11/2007 | Schmit et al. |
| 7,317,331 | B2 | 1/2008 | Teig et al. |
| 7,804,730 | B2 | 9/2010 | Redgrave et al. |
| 8,183,882 | B2 | 5/2012 | Teig et al. |
| 8,415,977 | B1* | 4/2013 | Oda ................. H03K 19/17772 326/41 |

(Continued)

FOREIGN PATENT DOCUMENTS

| JP | 2001-051826 | 2/2001 |
| JP | 2010-205108 | 9/2010 |
| JP | 2011-203920 | 10/2011 |

*Primary Examiner* — Hoai V Ho
*Assistant Examiner* — Minh Dinh
(74) *Attorney, Agent, or Firm* — Finnegan, Henderson, Farabow, Garrett & Dunner LLP

(57) ABSTRACT

According to an embodiment, a reconfigurable semiconductor integrated circuit includes first and second blocks. The first block includes first memories; and second memories; a selector selecting one first memory and one second memory; a first logic circuit whose logic is determined according to data read from the selected first memory; and a first switch circuit that is connected to first wires and switches connection between the first wires according to data read from the selected second memory, a part of the first wires being connected to the first logic circuit. The second block includes third and fourth memories; a second logic circuit whose logic is determined according to data read from the third memory; and a second switch circuit that is connected to second wires and switches connection between the second wires according to data read from the fourth memory, a part of the second wires being connected to the second logic circuit.

12 Claims, 19 Drawing Sheets

(56) References Cited

U.S. PATENT DOCUMENTS

| | | | |
|---|---|---|---|
| 2008/0123423 A1* | 5/2008 | Kim | G11O 5/025 365/185.11 |
| 2010/0228958 A1 | 9/2010 | Naito et al. | |
| 2011/0238954 A1 | 9/2011 | Naito et al. | |
| 2014/0035616 A1* | 2/2014 | Oda | H03K 19/0008 326/38 |
| 2014/0372426 A1* | 12/2014 | Garcia | H03K 19/1776 707/736 |
| 2015/0123706 A1* | 5/2015 | Cong | G11C 13/0002 326/41 |

* cited by examiner

RECONFIGURABLE SEMICONDUCTOR INTEGRATED CIRCUIT AND ELECTRONIC DEVICE

CROSS-REFERENCE TO RELATED APPLICATIONS

This application is based upon and claims the benefit of priority from Japanese Patent Application No. 2014-191763, filed on Sep. 19, 2014; the entire contents of which are incorporated herein by reference.

FIELD

Embodiments described herein relate generally to a reconfigurable semiconductor integrated circuit and an electronic device.

BACKGROUND

Field-programmable gate arrays (FPGAs) are configurable integrated circuits (ICs). An FPGA is typically constituted by an arrangement of tiles each including a logic block (LB) configured to output logic information and a switch block (SB) that connects LBs in a predetermined manner. Circuits constituting LBs and SBs include configuration memories, and the contents of the configuration memories can be rewritten to achieve a desired logic by an FPGA as a whole.

If dynamic reconfiguration, which is rewriting to configuration memories at a speed higher than the operating frequency of an FPGA, is possible, a large logic that is normally calculated by FPGAs can be calculated by a single FPGA. In practice, owing to constraints on the speed of writing to memory devices and on the power consumption of memory devices in writing data, it is difficult to conduct such high-speed rewriting to configuration memories as described above.

An existing dynamically reconfigurable FPGA has achieved a function equivalent to dynamic reconfiguration by including multiple configuration memories (multi-context memories) in which data have been written and switching reading from the multi-context memories at a higher speed than the operating frequency of the FPGA. Hereinafter, the number of configuration memories will be referred to as the number of contexts, and the number of a configuration memory to which a memory is switched will be referred to a context. In addition, a dynamically reconfigurable FPGA including multiple configuration memories in which data have been written will be referred to as a multi-context dynamically reconfigurable FPGA (MC-DPGA).

An MC-DPGA is subjected to constraints in implementation of functions different from those imposed on a normal FPGA. For implementing sequential circuits, blocks in an FPGA need to be implemented in such a manner that computations in circuits will be conducted in an appropriate sequence. When the blocks are implemented so that computations are conducted in an appropriate sequence, however, the frequencies of use of the blocks may vary and the effects of the MC-DPGA may not be sufficiently produced. Furthermore, circuits such as ring oscillators resulting in asynchronous circuits owing to a feedback occurring between circuits cannot be applied to dynamic reconfiguration.

It is difficult to provide the advantages of an MC-DPGA with a logic circuit including such circuits. In contrast, a basic tile constituted only by multi-context memories has a larger area than a basic tile constituted only by normal memories as a result of additional memories and an additional control circuit. Thus, the resulting area of the MC-DPGA may become larger when the advantages of the dynamic reconfiguration cannot be achieved.

DETAILED DESCRIPTION

According to an embodiment, a reconfigurable semiconductor integrated circuit includes a first block and a second block. The first block includes first memories; second memories; a selector that selects one of the first memories and one of the second memories; a first logic circuit whose logic is determined according to data read from the memory selected by the selector from the first memories; and a first switch circuit that is connected to first wires through which data are transmitted and switches connection between the first wires according to data read from the memory selected by the selector from the second memories, a part of the first wires being connected to the first logic circuit. The second block includes a third memory; a fourth memory; a second logic circuit whose logic is determined according to data read from the third memory; and a second switch circuit that is connected to second wires through which data are transmitted and switches connection between the second wires according to data read from the fourth memory, a part of the second wires being connected to the second logic circuit.

Figure 1:
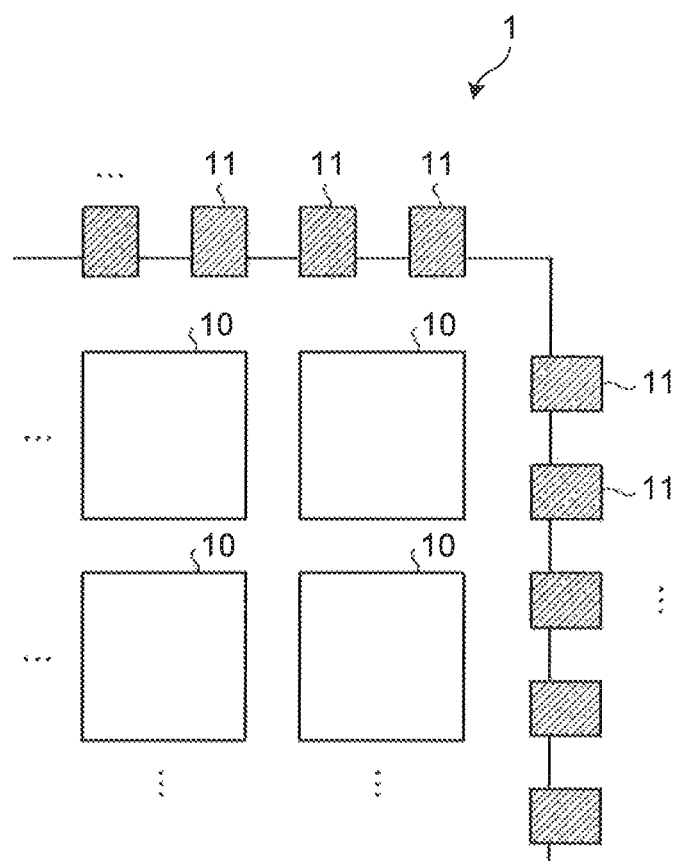
FIG. 1 is a diagram schematically illustrating an example of a FPGA.

A reconfigurable semiconductor integrated circuit and an electronic device according to embodiments will be described below. FIG. 1 schematically illustrates an example of a field-programmable gate array (FPGA) that is a reconfigurable semiconductor integrated circuit. In FIG. 1, an FPGA 1 includes one or more basic tiles 10, 10, . . . , and inputs and outputs (I/Os) 11, 11, . . . for connecting the basic tiles 10, 10, . . . to the outside of the FPGA 1.

Figure 2:
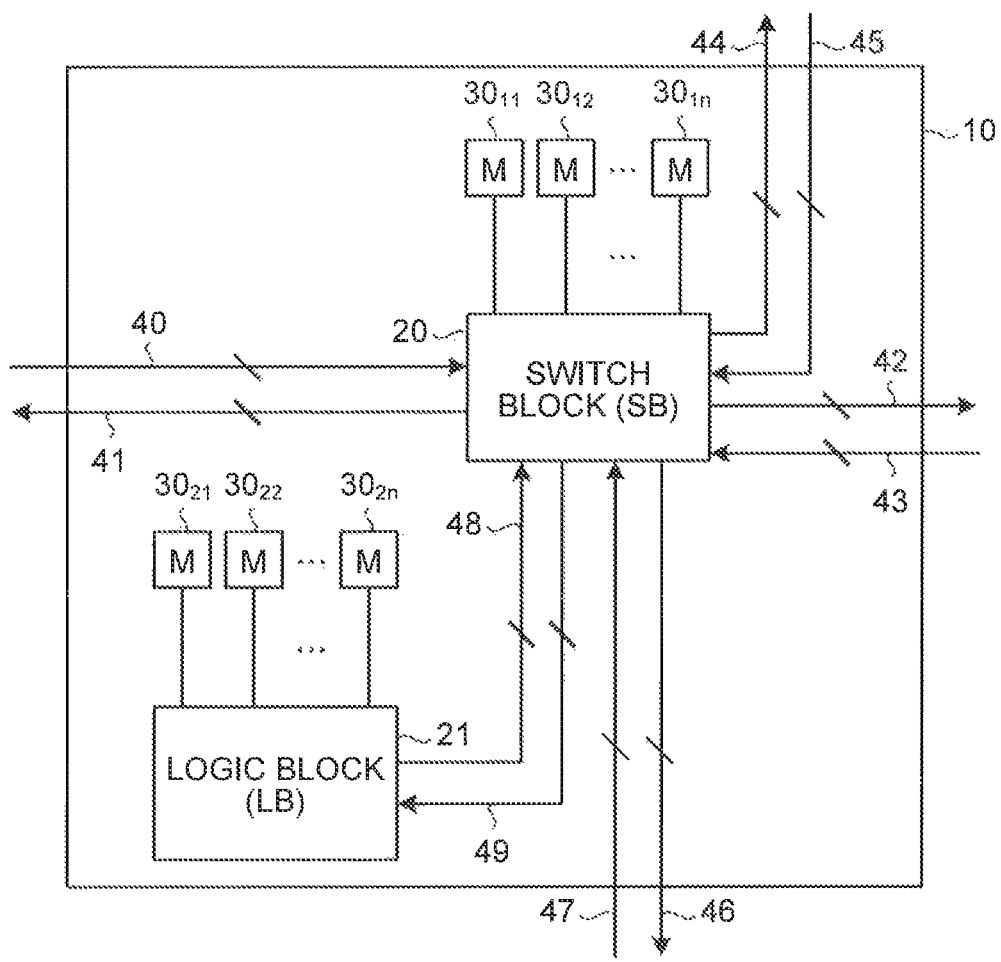
FIG. 2 is a block diagram illustrating an example of each basic tile.

FIG. 2 illustrates an example of each basic tile 10. Each of the basic tiles 10, 10, . . . includes a switch block 20 (hereinafter referred to as an SB 20) and a logic block 21 (hereinafter referred to as an LB 21). The LB 21 functions as a basic logic circuit determined according to values stored in memories (M) $30_{21}$, $30_{22}$, . . . , and $30_{2n}$. The SB 20 connects input and output paths to and from LBs 21, 21, . . . according to values steered in memories (M) $30_{11}$, $30_{12}$, . . . , and $30_{1n}$. Specifically, the SB 20 switches connection of wire bundles 40 and 41, wire bundles 42 and 43, wire bundles 44 and 45, and wire bundles 46 and 47 with adjacent tiles 10, and connection of wire bundles 48 and 49 between the SB 20 and the LB 21 according to values in the memories (M) $30_{11}$, $30_{12}$, . . . , and $30_{1n}$.

Note that the memories (M) $30_{11}$, $30_{12}$, . . . , and $30_{1n}$ storing values according to which operation of the SB 20 is determined and the memories (M) $30_{21}$, $30_{22}$, . . . , and $30_{2n}$ storing values according to which a logic circuit of the LB 21 is determined are called configuration memories. Hereinafter, the configuration memories will be simply referred to as memories unless otherwise stated.

Figure 3:
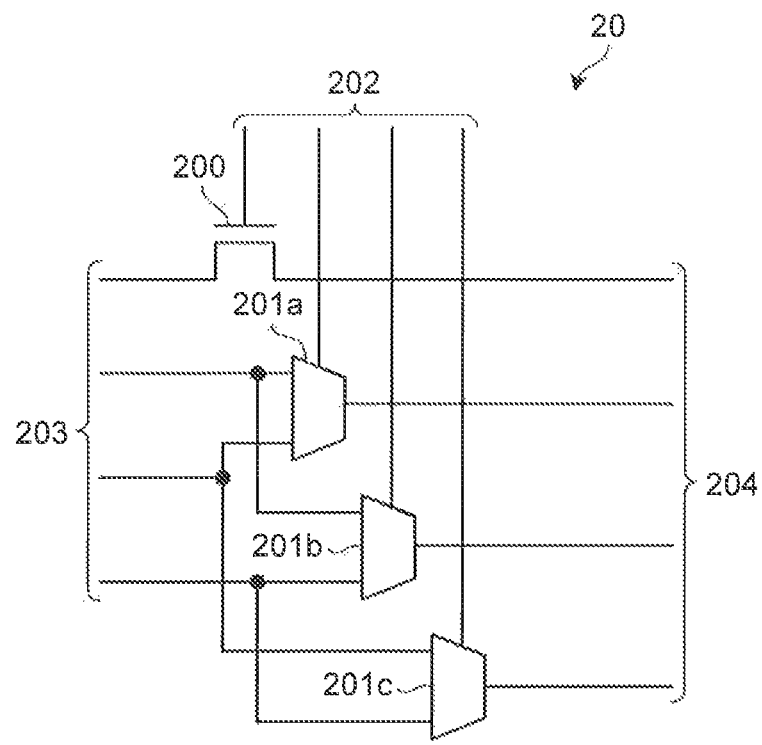
FIG. 3 is a circuit diagram illustrating an example of a switch block.

FIG. 3 illustrates an example of the SB 20. The SB 20 determines whether or not to allow an input signal to pass therethrough. In the example of FIG. 3, the SB 20 uses a switch element 200 and multiplexers 201a to 201c to determine whether or not to allow signals input through a wire bundle 203 to pass therethrough according to values 202 input from the memories (M) $30_{11}$, $30_{12}$, . . . , and $30_{1n}$ through respective memory input lines, and when a signal is to pass therethrough, determines a wire of a wire bundle 204 to which the signal is to be output. Note that the SB 20 is illustrated as using the switch element 200 and the multiplexers 201a to 201c in combination in FIG. 3, but the SB 20 is not limited to this example. Specifically, the SB 20 may use only the switch element, may use only the multiplexers, or may further use another switching means to determine passage of a signal and connection.

Figure 4:
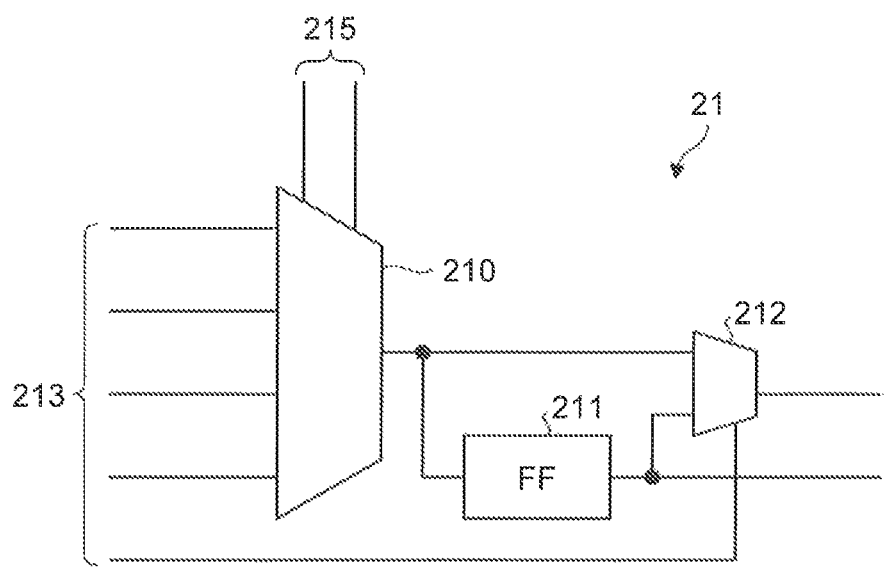
FIG. 4 is a circuit diagram illustrating an example of a logic block.

FIG. 4 illustrates an example of the LB 21. In the example of FIG. 4, the LB 21 includes multiplexers 210 and 212, and a flip-flop (FF) circuit 211. The LB 21 performs a predetermined output in response to an input in such a manner as selecting and outputting one of values 213 input from the memories (M) $30_{21}$, $30_{22}$, . . . , and $30_{2n}$ according to a signal input through a wire bundle 215. Note that the configuration of the LB 21 is not limited to this example.

Note that configurations of the memories (M) $30_{11}$, $30_{12}$, . . . , and $30_{1n}$ and the memories (M) $30_{21}$, $30_{22}$, . . . , and $30_{2n}$ capable of being subjected to dynamic reconfiguration, which is rewriting at a speed higher than the operating frequency of the FPGA 1, allow a large logic that is normally calculated by FPGAs 1 to be calculated by a single FPGA 1. It is, however, difficult to enable dynamic reconfiguration even by using static random access memories (SRAMs) rewritable at high speed, in light of the writing speed and power.

Figure 5:
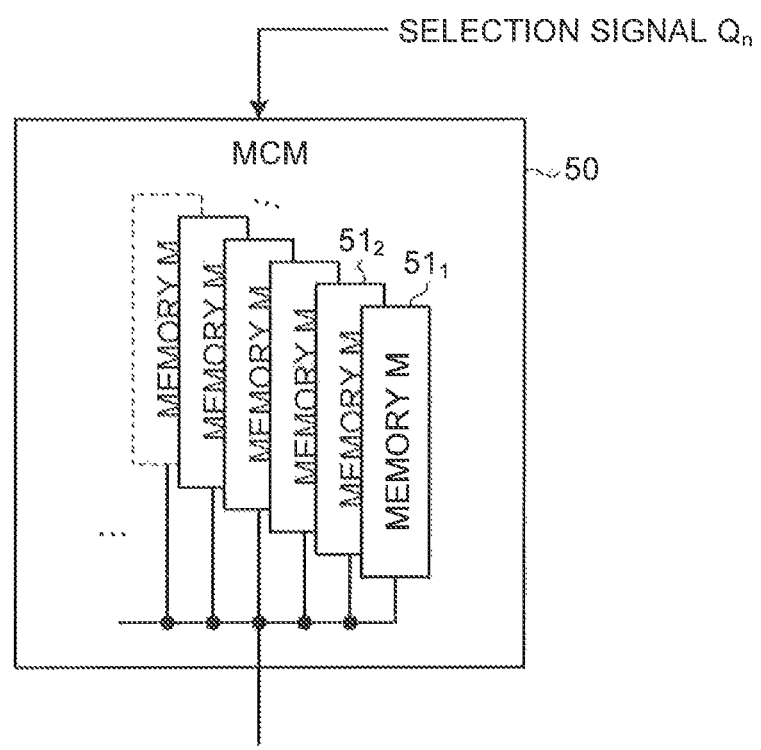
FIG. 5 is a circuit diagram illustrating an example of a multi-configuration memory.

Thus, as illustrated in FIG. 5, a technique of configuring a multi-context memory 50 (hereinafter referred to as an MCM 50) including memories (M) $51_1$, $51_2$, . . . that correspond to the memories (M) $30_{11}$, $30_{12}$, . . . , and $30_{1n}$ and the memories (M) $30_{21}$, $30_{22}$, . . . , and $30_{2n}$ mentioned above and that are connected in parallel, and switching the memories $51_1$, $51_2$, . . . included in the MCM 50 by a selection signal $Q_n$ at a higher speed than the operating frequency of the FPGA 1 is known.

Figure 6:
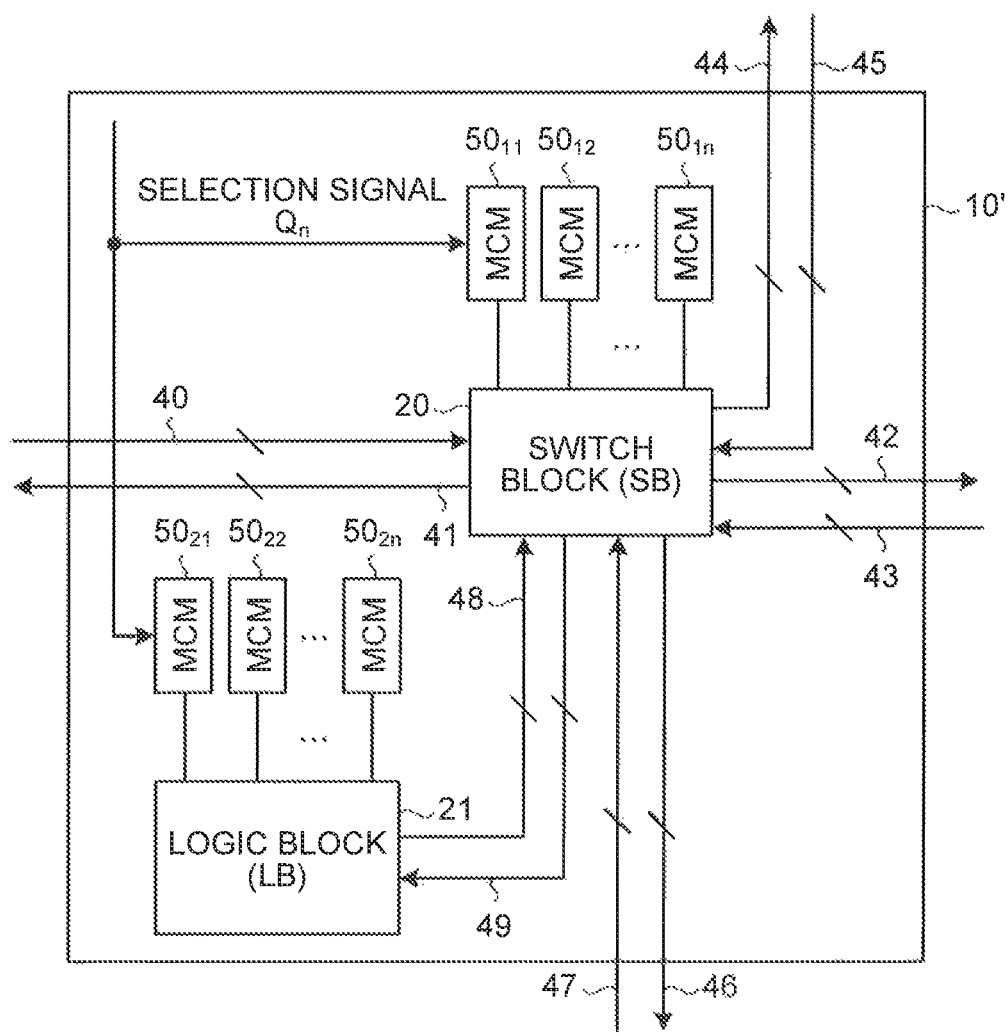
FIG. 6 is a block diagram illustrating an example of a basic tile including multi-configuration memories.

FIG. 6 illustrates an example of a basic tile 10' including MCMs 50. In FIG. 6 and subsequent similar figures, components that are the same as those in FIG. 2 described above will be designated by the same reference numerals and detailed description thereof will not be repeated. In FIG. 6, MCMs $50_{11}$, $50_{12}$, . . . , and $50_{1n}$ instead of the aforementioned memories (M) $30_{11}$, $30_{12}$, . . . , and $30_{1n}$ are connected to the SB 20. In addition, MCMs $50_{21}$, $50_{22}$, . . . , and $50_{2n}$ instead of the aforementioned memories (M) $30_{21}$, $30_{22}$, . . . , and $30_{2n}$ are connected to the LP 21. A selection signal $Q_n$ is supplied to the MCMs $50_{11}$, $50_{22}$, . . . , and $50_{1n}$ and the MCMs $50_{21}$, $50_{22}$, . . . , and $50_{2n}$. In each of the MCMs $50_{11}$, $50_{12}$, . . . , and $50_{1n}$ and the MCMs $50_{21}$, $50_{22}$, . . . , and $50_{2n}$, one of the memories (M) $51_1$, $51_2$, . . . is selected according to the selection signal $Q_n$. The SB 20 and the LB 21 switch between paths or perform an output according to values read from the memories (M) 51 selected in the MCMs $50_{11}$, $50_{12}$, . . . , $50_{1n}$ and the MCMs $50_{21}$, $50_{22}$, . . . , and $50_{2n}$, respectively.

The use of the MCMs 50 as described above allows implementation of a multi-context dynamically reconfigurable integrated circuit having a function equivalent to dynamic reconfiguration.

Hereinafter, the number of memories (M) $51_1$, $51_2$, . . . , included in an MCM 50 will be referred to as the number of contexts. In addition, when numbers are sequentially assigned to the memories (M) $51_1$, $51_2$, . . . in an MCM 50, the numbers of the memories (M) $51_1$, $51_2$, . . . between which switching is to be conducted will be referred to as contexts.

Furthermore, the basic tile 10 in which the memories (M) $30_{11}$, $30_{12}$, . . . , and $30_{1n}$ each constituted by a single memory are connected to the SB 20 and the memories (M) $30_{21}$, $30_{22}$, . . . , and $30_{2n}$ each constituted by a single memory are connected to the LB 21 as illustrated in FIG. 2 will be referred to as a single-context block, and an FPGA constituted by the single-context blocks will be referred to as a single-context FPGA. In contrast, the basic tile 10' in which the MCMs $50_{11}$, $50_{12}$, . . . , and $50_{1n}$ each including memories are connected to the SB 20 and the MCMs $50_{21}$, $50_{22}$, . . . , and $50_{2n}$ each including memories are connected to the LB 21 as illustrated in FIG. 6 will be referred to as a multi-context block, and an FPGA constituted by the multi-context blocks will be referred to a multi-context dynamically reconfigurable FPGA (MC-DPGA).

Figure 7:
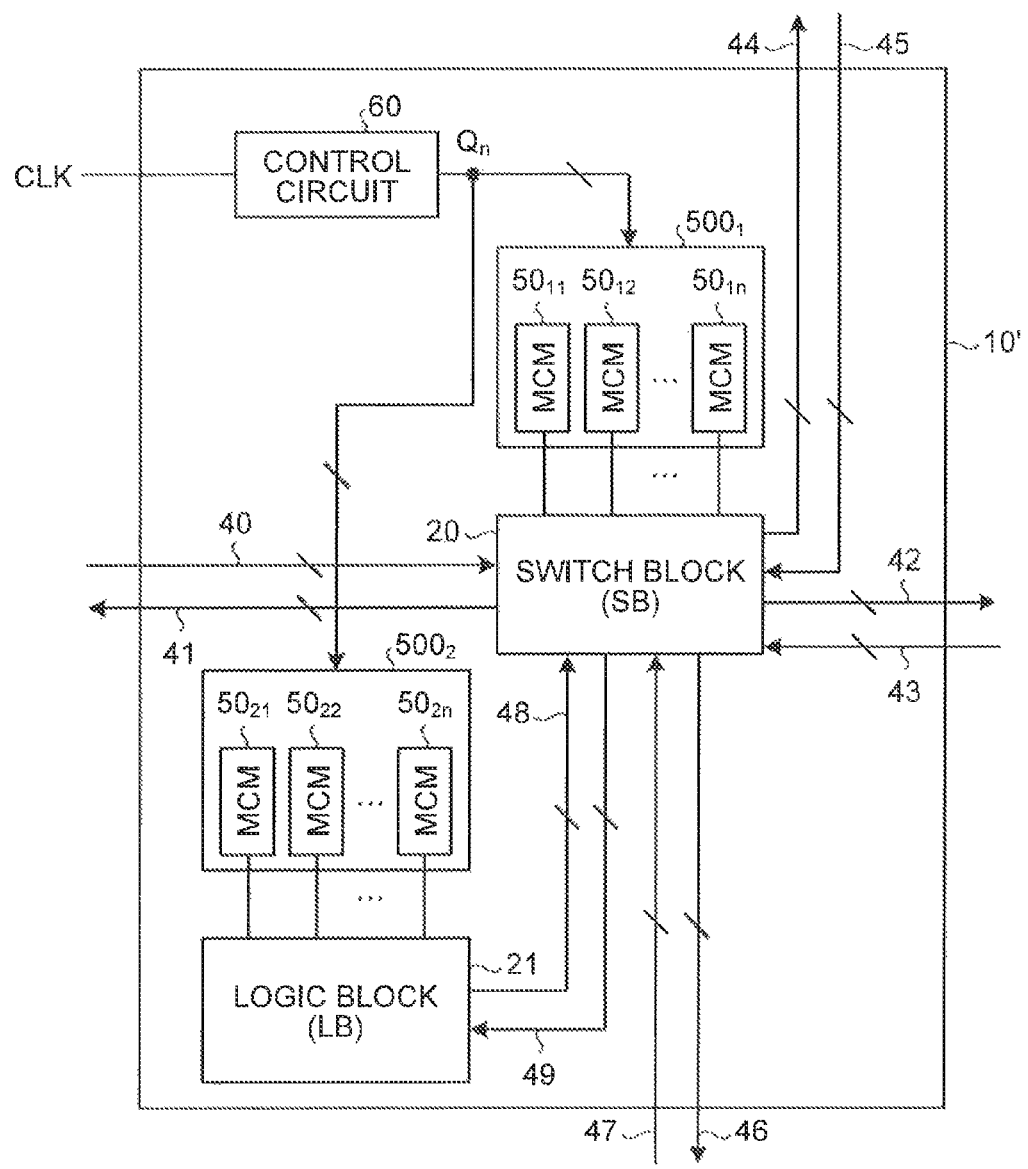
FIG. 7 is a block diagram illustrating an example in which a basic tile includes a control circuit configured to generate a selection signal.

FIG. 7 illustrates an example in which the basic tile 10' includes a control circuit 60 configured to generate a selection signal $Q_n$. The control circuit 60 generates a selection signal $Q_n$ on the basis of a clock CLK input thereto. When the clock CLK is a user clock used for the operation of the FPGA 1, the control circuit 60 has a frequency multiplier circuit. The selection signal $Q_n$ is used for selecting a configuration memory (memory (M) $51_1$, $51_2$, . . . ) in each of the MCMs $50_{11}$, $50_{12}$, . . . , and $50_{1n}$ and the MCMs $50_{21}$, $50_{22}$, . . . , and $50_{2n}$. The selection signal $Q_n$ is input to an MCM block $500_1$ including the MCMs $50_{11}$, $50_{12}$, . . . , and $50_{1n}$ and an MCM block $500_2$ including the MCMs $50_{21}$, $50_{22}$, . . . , and $50_{2n}$, and supplied to the MCMs $50_{11}$, $50_{12}$, . . . , and $50_{1n}$ and the MCMs $50_{21}$, $50_{22}$, . . . , $50_{2n}$.

Figure 8:
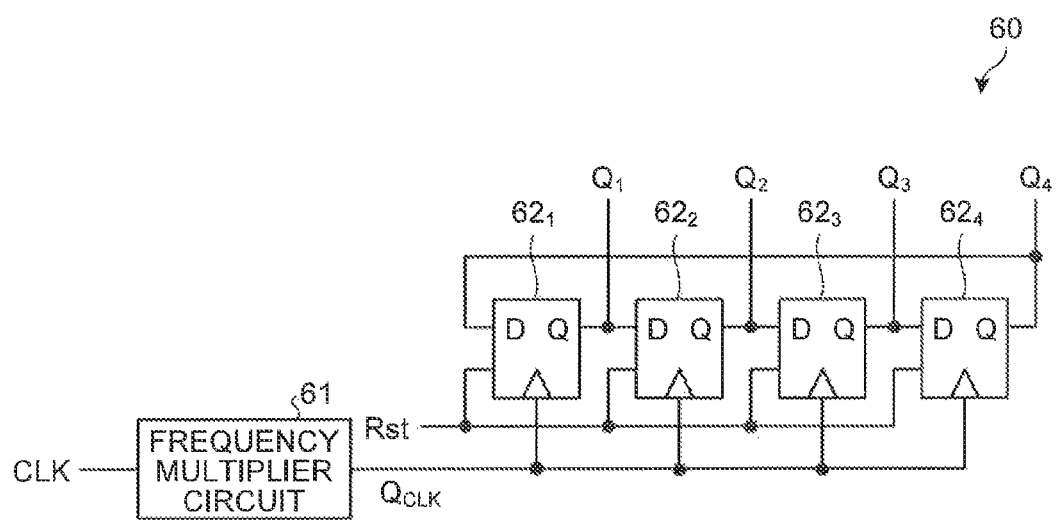
FIG. 8 is a circuit diagram illustrating an example of the control circuit.

FIG. 8 illustrates an example of the control circuit 60. In the example of FIG. 8, the control circuit 60 includes a frequency multiplier circuit 61 and a shift register constituted by flip-flop circuits $62_1$, $62_2$, . . . . In this example, the control circuit 60 is illustrated as having four flip-flop circuits $62_1$ to $62_4$. The frequency multiplier circuit 61 generates a clock $Q_{CLK}$ that is faster than a clock CLK supplied thereto from the clock CLK. The clock $Q_{CLK}$ is supplied to each of the flip-flop circuits $62_1$ to $62_4$ constituting the shift register. The flip-flop circuits $62_2$ to $62_4$ out of the flip-flop circuits $62_1$ to $62_4$ are reset by a reset signal Rst, and only the flip-flop circuits $62_1$ is set to a value "1" by the reset signal Rst. The set value "1" is output as selection signals $Q_1$ to $Q_4$ in a cyclic manner according to the signal $Q_{CLK}$.

Figure 9:
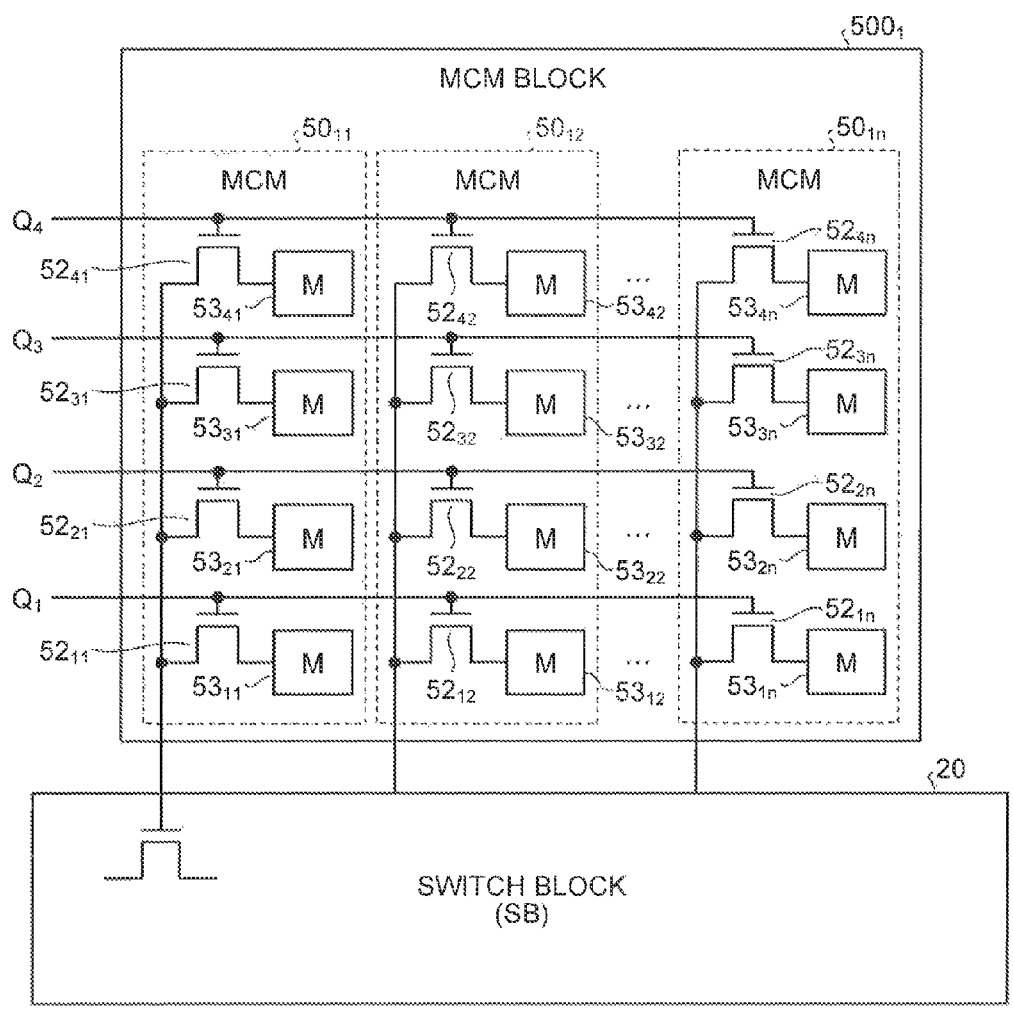
FIG. 9 is a diagram illustrating an example of a multi-configuration memory.

FIG. 9 explains the configurations of the MCMs $50_{11}$, $50_{12}$, . . . , and $50_{1n}$ taking the MCM block $500_1$ connected to the SB 20 as an example. Since the MCM block $500_2$ has a configuration similar to that of the MCM block $500_1$, the description thereof will not be provided herein. In this example, for convenience of explanation, the MCM $50_{11}$ includes four storages (M) $53_{11}$, $53_{21}$, $53_{31}$, and $53_{41}$ selected by the selection signals $Q_1$ to $Q_4$, respectively, for example. Furthermore, the storages (M) $53_{11}$, $53_{21}$, $53_{31}$, and $53_{41}$ are connected with switches $52_{11}$, $52_{21}$, $52_{31}$, and $52_{41}$ that are controlled to open and close according to the selection signals $Q_n$. The switches $52_{11}$, $52_{21}$, $52_{31}$, and $52_{41}$ are n-type MOS transistors in the example, but may alternatively be p-type MOS transistors or transfer gates using both.

Note that the selection signals $Q_1$ to $Q_4$ are input in common to the MCMs $50_{11}$, $50_{12}$, . . . , and $50_{1n}$. Specifically, the storages (M) $53_{11}$, $53_{12}$, . . . , and $53_{1n}$ are connected with the switches $52_{11}$, $52_{12}$, . . . , and $52_{1n}$, respectively, which are controlled to open and close in common according to the selection signal $Q_1$. Similarly, the storages (M) $53_{21}$, $53_{22}$, . . . , and $53_{2n}$ are connected with the switches $52_{21}$, $52_{22}$, . . . , and $52_{2n}$, respectively, which are controlled to open and close in common according to the selection signal $Q_2$, and the storages (M) $53_{31}$, $53_{32}$, . . . , and $53_{3n}$ are connected with the switches $52_{31}$, $52_{32}$, . . . , and $52_{3n}$, respectively, which are controlled to open and close in common according to the selection signal $Q_3$. Furthermore, the storages (M) $53_{41}$, $53_{42}$, . . . , and $53_{4n}$ are connected with the switches $52_{41}$, $52_{42}$, . . . , and $52_{4n}$, respectively, which are controlled to open and close in common according to the selection signal $Q_4$.

Note that the memory $M51_1$, for example, in FIG. 5 described above can be considered as including the storage (M) $53_{11}$ and the switch $52_{11}$, for example.

Outputs of the switches $52_{11}$, $52_{21}$, $52_{31}$, and $52_{41}$ in the MCM $50_{11}$ are input in common to the SB 20 via a first memory input line, for example. Outputs of the switches $52_{12}$, $52_{22}$, $52_{32}$, and $52_{42}$ in the MCM $50_{12}$ are input in common to the SB 20 via a second memory input line, for example. Similarly, outputs of the switches $52_{1n}$, $52_{2n}$, $52_{3n}$, and $52_{4n}$ in the MCM $50_{1n}$ are input in common to the SB 20 via an n-th memory input line, for example.

In such a configuration, when the selection signal $Q_4$, for example, output from the control circuit 60 in FIG. 8 is input to the MCM block $500_1$, the switches $52_{41}$, $52_{42}$, . . . , and $52_{4n}$ included in the MCMs $50_{11}$, $50_{12}$, . . . , and $50_{1n}$, respectively, are turned on, that is, are closed, and data stored in the storages (M) $53_{41}$, $53_{42}$, . . . , and $53_{4n}$ are supplied to the SB 20 via the first, second, . . . , and n-th memory input lines, respectively. Subsequently, when the selection signal $Q_1$, is input to the MCM block $500_1$, the switches $52_{11}$, $52_{12}$, . . . , and $52_{1n}$ included in the MCMs $50_{11}$, $50_{12}$, . . . , and $50_{1n}$, respectively, are turned on, and data stored in the storages (M) $53_{11}$, $53_{12}$, . . . , and $53_{1n}$ are supplied to the SB 20 via the first, second, . . . , and n-th memory input lines, respectively.

As a result of inputting the selection signals $Q_1$ to $Q_4$ output from the control circuit 60 in FIG. 8 to the MCMs $50_{11}$ to $50_{1n}$, in this manner, in the case of the MCM $50_{11}$, for example, data stored in the storages (M) $53_{11}$, $53_{21}$, $53_{31}$, and $53_{41}$ can be supplied sequentially to the SB 20 in a cyclic manner.

Figure 10:
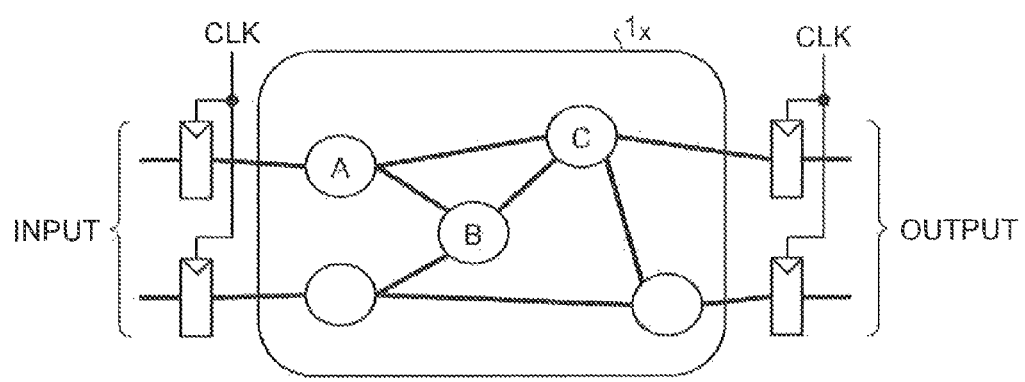
FIG. 10 is a diagram for explaining constraints in implementing functions on a multi-context dynamically reconfigurable FPGA.

In implementation of functions on a multi-context dynamically reconfigurable FPGA as described above, constraints different from those imposed on a normal FPGA constituted by the basic tiles 10 illustrated in FIG. 2 are imposed. The constraints will be described with reference to FIG. 10. FIG. 10 conceptually illustrates an example of combinational logic circuits configured in a multi-context dynamically reconfigurable FPGA $1x$. In the example of FIG. 10, an output of a circuit A is input to a circuit B, and an output of the circuit B and the output of the circuit A are input to a circuit C. The circuits A, B, and C are assumed to be circuits formed by switching between contexts of the MCMs $50_{11}$, $50_{12}$, . . . , and $50_{1n}$ and the MCMs $50_{21}$, $50_{22}$, . . . , and $50_{2n}$ in one basic tile 10'.

Note that data are input to and output from the FPGA $1x$ according to the clock CLK. In the meantime, the combinational circuits A, B, and C are switched according to the clock $Q_{CLK}$ faster than the clock CLK. Thus, after computations by the circuits A, B, and C are performed sequentially in response to an input of a timing of a clock CLK, for example, the contexts may be switched and the circuit C may be configured before the next timing of the clock CLK. If computation of the circuit C may be performed before computation of the circuit B, the output result from the circuit B to be input to the circuit C is not known to the circuit C, which may result in an incorrect response. Thus, to obtain a correct response, the implementation is required to be in such a manner that computations by the logic circuits are performed in a correct sequence.

Figure 11:
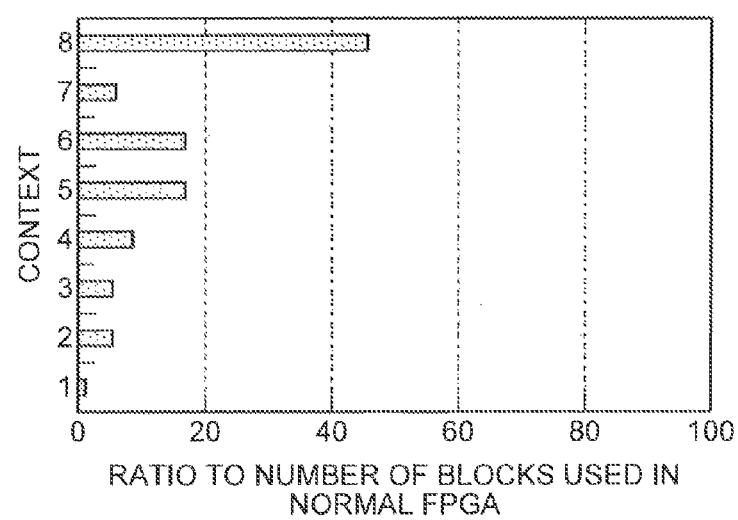
FIG. 11 is a graph illustrating an example result of operation simulation on a multi-context dynamically reconfigurable FPGA.

FIG. 11 illustrates a result of applying a layout and wiring to a benchmark circuit constituted by a combination of logic circuits in a multi-context dynamically reconfigurable FPGA. This layout and wiring are designed in full consideration of the sequence of computations of the logic circuits described above not to cause any inconsistency in the computation sequence. In the example of FIG. 11, it is assumed that the numbers of contexts of the MCMs $50_{11}$, $50_{12}$, . . . , and $50_{1n}$ and the MCMs $50_{21}$, $50_{22}$, . . . , and $50_{2n}$ included in each of the basic tiles 10' of the FPGA are eight. In FIG. 11, the vertical axis represents the context, and the horizontal axis represents a ratio of the number of used blocks when the number of used blocks in a normal FPGA (single-context FPGA) is assumed to be 100.

As illustrated in FIG. 11, it can be seen that the number of used blocks may vary among contexts in a multi-context dynamically reconfigurable FPGA. In the example of FIG. 11, the number of used blocks is significantly larger with the context "8," and the number of used blocks vary among the contexts. This means that there may be a multi-context block in which only one context is used even though the block has eight contexts to be switched to. According to the example of FIG. 11, it is probable that there are many blocks in which only the context "8" is used. In this case, the effects of multiple contexts may not be fully produced.

Figure 12:
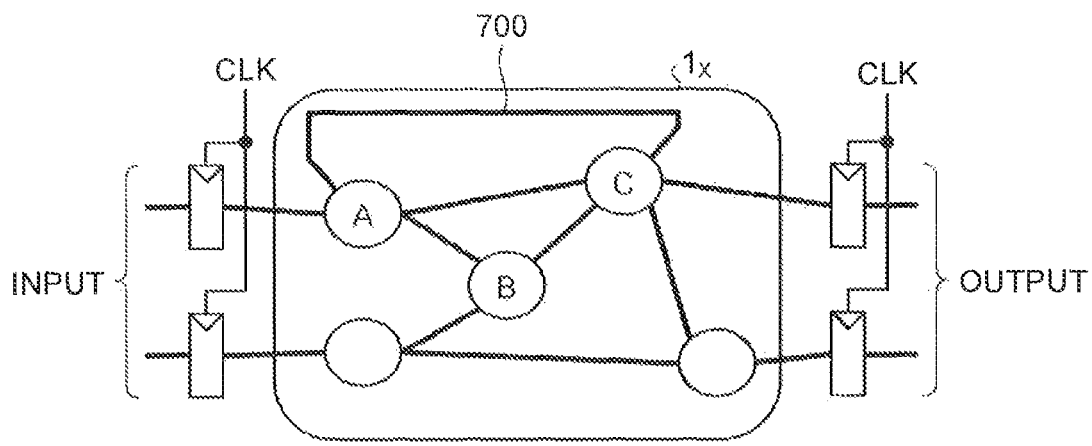
FIG. 12 is a diagram illustrating an example in which a feedback path is provided between circuits.

Furthermore, in a case where a feedback path 700 is generated between circuits as illustrated in FIG. 12, the effects of multiple contexts are also reduced. A ring oscillator, for example, has such a configuration. A ring oscillator is what is called an asynchronous circuit and has to operate irrespective of a clock CLK.

In the multi-context block described above, switching of contexts, that is, the memories (M) $51_1$, $51_2$, . . . in the MCMs 50 is performed according to a clock CLK input from outside. Thus, the circuits A, B, and C that are asynchronous circuits owing to the feedback path 700 cannot constitute a multi-context configuration. Specifically, in the circuits A, B, and C, the same data need to be written in all of the memories (M) $51_1$, $51_2$, . . . in the MCMs 50 and the circuits A, B, and C need to operate independently of context switching.

It is difficult to provide the advantages of a multi-context configuration with a logic circuit in which such circuits are present. In contrast, as described with reference to FIGS. 5 to 7, the basic tile 10', which is a multi-context block, has a larger area than the basic tile 10 of a single-context block owing to additional memories (the memories $51_1$, $51_2$, . . . of the MCMs 50) and the additional control circuit (control circuit 60). Thus, the disadvantage of the enlarged area may be focused when the advantages of the multi-context configuration cannot be produced.

First Embodiment

Figure 13:
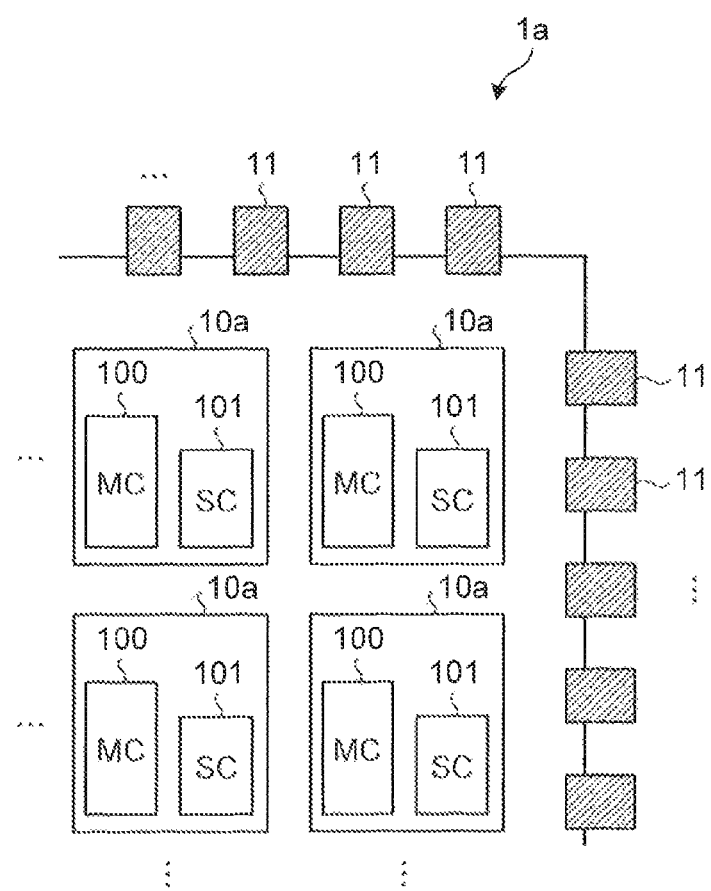
FIG. 13 is a block diagram illustrating an example of an FPGA according to a first embodiment.
Figure 14:
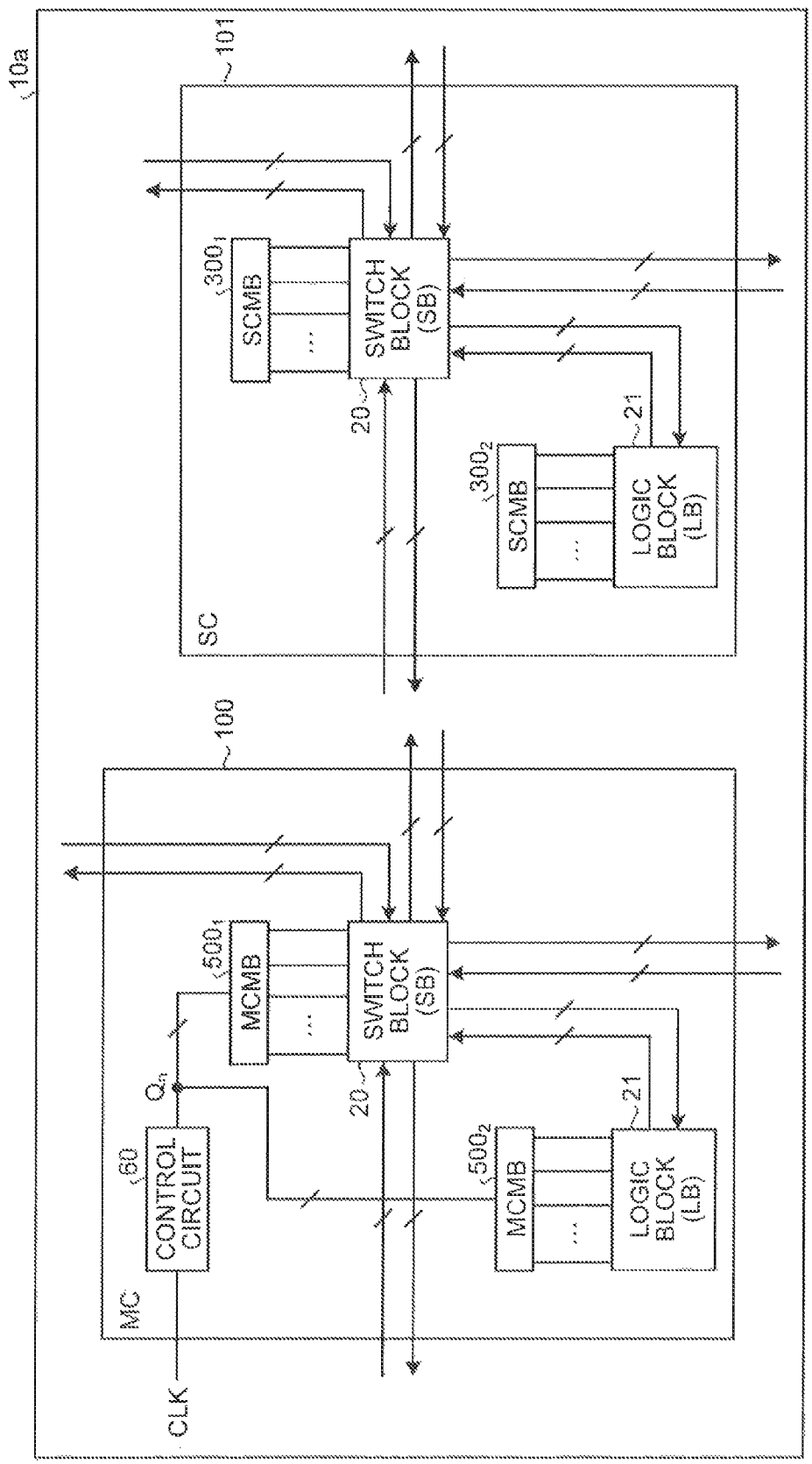
FIG. 14 is a block diagram illustrating an example of a basic tile according to a first embodiment in more detail.

Next, a first embodiment will be described with reference to FIGS. 13 and 14. In FIGS. 13 and 14, components that are the same as those in FIGS. 1, 2, and 7 described above will be designated by common reference numerals and detailed description thereof will not be repeated.

FIG. 13 illustrates an example of an FPGA 1a according to the first embodiment. In FIG. 13, the FPGA 1a according to the first embodiment includes basic tiles 10a, 10a, . . . each including one or more multi-context blocks 100 and one or more single-context blocks 101. Hereinafter, a multi-context block 100 will be abbreviated to an MC 100, and a single-context block 101 will be abbreviated to an SC 101.

FIG. 14 illustrates an example of the basic tiles 10a according to the first embodiment in more detail. The SC 101 has the same configuration as that in the basic tile 10 illustrated in FIG. 2, and includes an SB 20 and an LB 21, and memories (M) $30_{11}$, $30_{12}$, . . . , and $30_{1n}$ and memories (M) $30_{21}$, $30_{22}$, . . . , and $30_{2n}$ connected to the SB 20 and the LB 21, respectively. In FIG. 14, the memories (M) $30_{11}$, $30_{12}$, . . . , and $30_{1n}$ and the memories (M) $30_{21}$, $30_{22}$, . . . , and $30_{2n}$ are illustrated collectively as single-context memory blocks (SCMBs) $300_1$ and $300_2$, respectively.

The MC 100 corresponds to the configuration of the basic tile 10' illustrated in FIG. 7 described above, and includes an SB 20 and an LB 21, MCMs $50_{11}$, $50_{12}$, . . . , and $50_{1n}$, and MCMs $50_{12}$, $50_{22}$, . . . , and $50_{2n}$ connected to the SB 20 and the LB 21, respectively, and a control circuit 60 configured to generates a clock $Q_{CLK}$ to be supplied to the MCMs $50_{11}$, $50_{12}$, . . . , and $50_{1n}$ and the MCMs $50_{12}$, $50_{22}$, . . . , $50_{2n}$ on the basis of the clock CLK input from outside. In FIG. 14, the MCMs $50_{11}$, $50_{12}$, . . . , and $50_{1n}$ and the MCMs $50_{12}$, $50_{22}$, . . . , and $50_{2n}$ are illustrated collectively as multi-context memory blocks (MCMBs) $500_1$ and $500_2$.

All the basic tiles included in the FPGA 1a are illustrated as being the basic tiles 10a each including the MC 100 and the SC 101 in FIG. 13, the basic tiles are not limited this example. The FPGA 1a according to the first embodiment can be configured using the basic tiles 10a, the basic tiles 10 constituted by the SCs 101, and the basic tiles 10' constituted by the multi-context blocks in combination.

Figure 15:
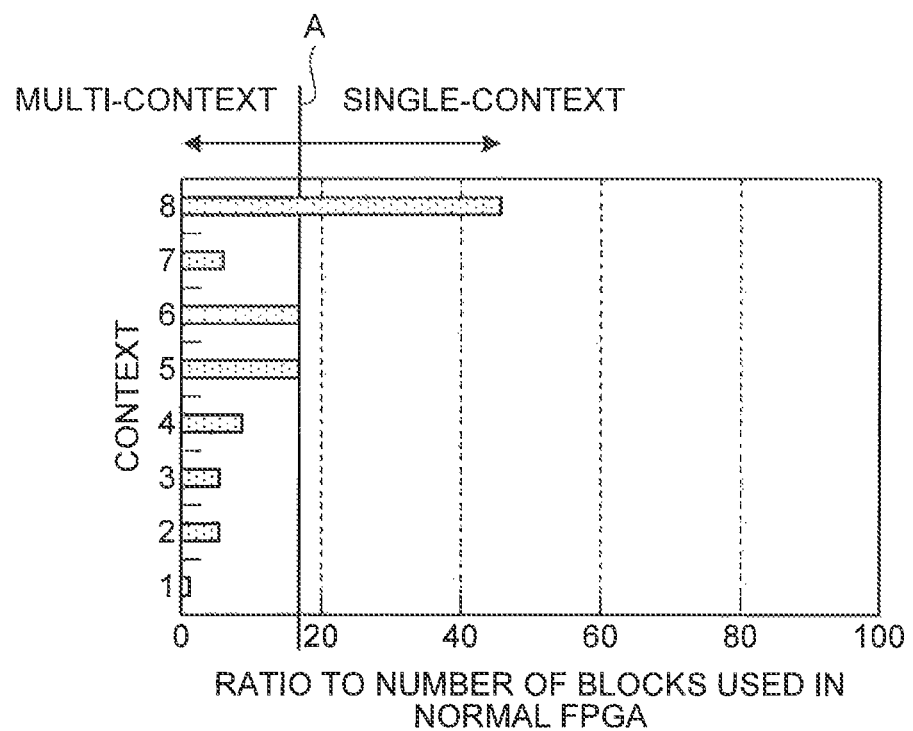
FIG. 15 is a graph for explaining allocation of a context with a large number of used blocks to a basic block constituted by a single-context block according to the first embodiment.

For example, according to the variation in the number of used blocks among the contexts described with reference to FIG. 11, contexts with larger numbers of used blocks may be assigned to the basic tiles 10 constituted by single-context blocks. As illustrated in FIG. 15 citing FIG. 11, for example, parts of contexts where the number of used blocks is equal to or larger than a predetermined number (indicated by a line A in FIG. 15) are assigned to basic tiles 10 constituted by single-content blocks.

Specifically, in FIG. 15, the parts on the left side of the line A represent blocks used in multiple contexts. On the other hand, the parts on the right side of the line A represent blocks that are used only in the context "8." The blocks used only in the context "8" can be configured using the basic tiles 10 each including only an SC 101.

In practice, when all of the basic tiles in an FPGA are the basic tiles 10' constituted by multi-context blocks, the numbers of used blocks in each context in all of the basic tiles 10a vary depending on a circuit configuration to be achieved by the FPGA. Thus, for actual products, several types of FPGAs with different ratios of the basic tiles 10a according to the first embodiments to the basic tiles 10 constituted by single-context blocks may be provided.

Connections between MCs 100 and SCs 101 in the FPGA 1a according to the first embodiment will be schematically described with reference to FIGS. 16A and 16B. Herein, an example in which MCs $100_1$ and $100_2$ and an SC $101_1$ are used and the MC $100_1$ can be connected to the MC $100_2$ via the SC $101_1$ will be described.

As described earlier, in the SC $101_1$, with reference to the SB 20, after writing is performed once on the memory $30_1$, the values in the memories $30_1$ and $30_2$ are fixed and connection by the SB 20 is also fixed. In contrast, in the multi-context block $100_1$ and $100_2$, the connections by the SBs 20 can be changed by switching between the memories (M) $51_1$, $51_2$, . . . in the MCMs $50_{11}$ to $50_{1n}$.

Here, assume a case of a context #n in which the MC $100_1$ is connected to the SC$101_1$, which is further connected to the MC $100_2$, for example. In this case, the values of the memories $30_{11}$ to $30_{1n}$ are set in advance so that the SC $101_1$ will be connected to the MCs $100_1$ and $100_2$ in the context #n.

Furthermore, the value of the memory (M) $51_n$ in the context #n in each of the MCMs $50_{11}$ to $50_{1n}$ is set so that multi-context blocks of the MCs $100_1$ and $100_2$ will be connected at the position of the wiring in the context #n. As a result, in a context other than the context #n, such as the context #1, for example, connections from the MC $100_1$ and $100_2$ to the SC $101_1$ are not made and the SC $101_1$ is not used as illustrated in FIG. 16A. In the context #n, connections from the MC $100_1$ and $100_2$ to the SC $101_1$ are made and the SC $101_1$ is not used as illustrated in FIG. 16B.

Figure 16A:
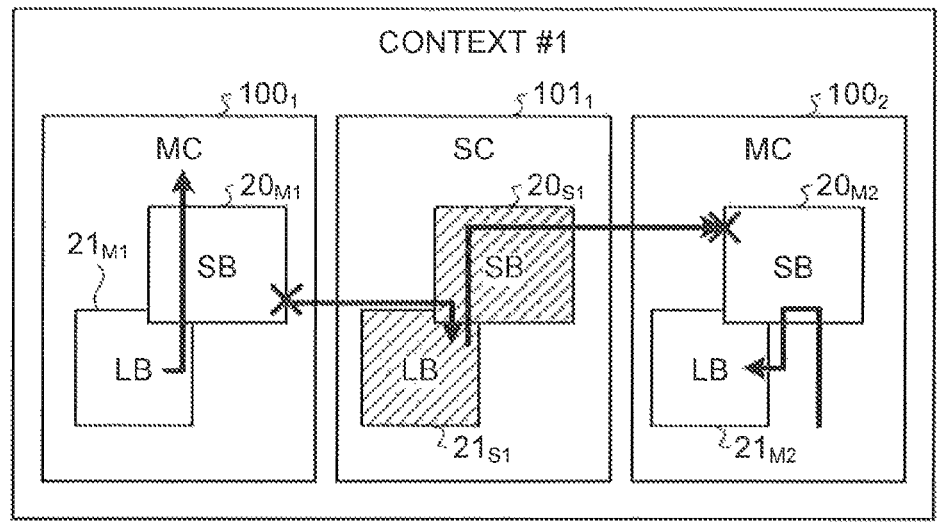
FIGS. 16A and 16B are diagrams for explaining connection between a multi-context block and a single-context block in an FPGA according to the first embodiment.

More specifically, in the example of FIG. 16A, in the context #1, an SB $20_{M1}$ in the MC $100_1$ does not connect the output, for example, of an LB $21_{M1}$ therein to an SB $20_{M1}$ of the $SC101_1$. Similarly, in the context #1, an SB $20_{M2}$ in the MC $100_2$ does not connect an input, for example, of an LB $21_{M2}$ therein to the SB $20_{S1}$ of the SC $101_1$. Thus, data are not input to and output from the SC $101_1$ and the SC $101_1$ is thus not used.

Figure 16B:
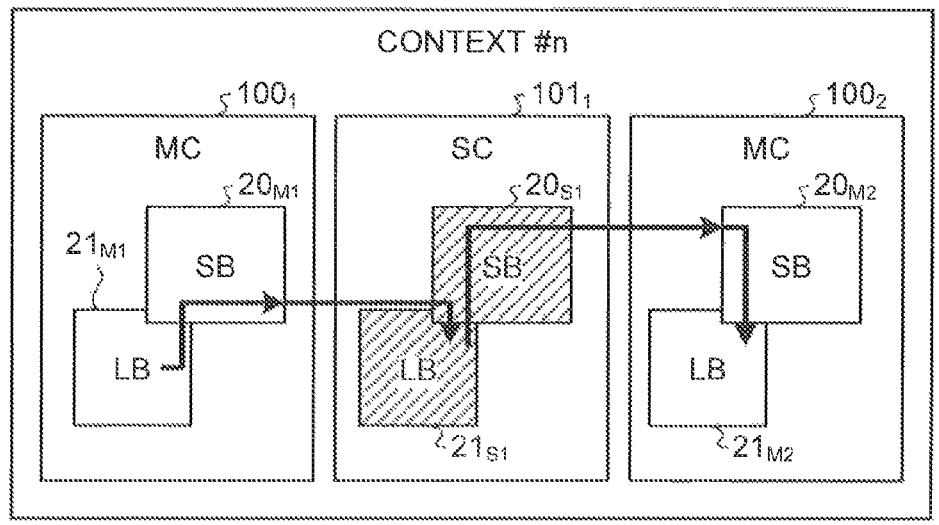

In contrast, in the example of FIG. 16B, in the context #n, the SB $20_{M1}$ in the MC $100_1$ connects the output of the LB $21_{M1}$ to the SB $20_{S1}$ in the $SC101_1$. The SB $20_{S1}$ connects the output of the LB $21_{M1}$ to an LB $21_{S1}$. Furthermore, an SB $20_{M2}$ in the MC $100_2$ connects the input of an LB $21_{M2}$ to the output of the SB $20_{S1}$ in the SC $101_1$. Thus, the SC $101_1$ can perform logical operation in the LB $21_{S1}$ on the output from the MC $100_1$, and output a logical operation result to the MC $100_2$.

Figure 17:
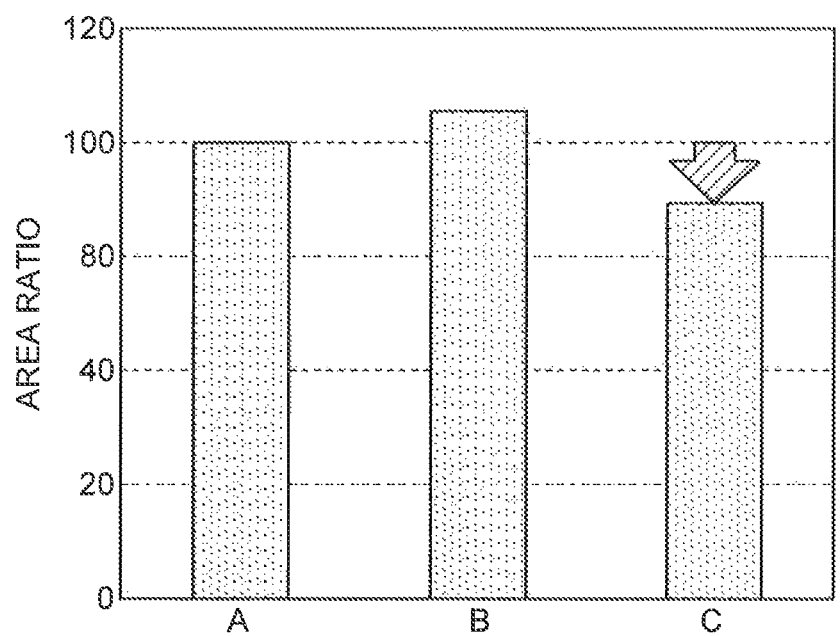
FIG. 17 is a graph illustrating an example of a result of applying the configuration according to the first embodiment to a benchmark circuit used in simulation.

FIG. 17 illustrates an example of a result of applying the configuration according to the first embodiment to the benchmark circuit used in the simulation in FIGS. 11 and 15. In FIG. 17, the vertical axis represents a mounting area ratio with a bar A representing 100. The bar A represents the area of a normal FPGA. A bar B represents an area of an FPGA constituted only by the basic tiles 10' constituted by MCs 100. In this case, the basic tile 10' has eight contexts, and MCMs $50_1$ and $50_2$ each include eight memories $51_1$, $51_2$, .... Furthermore, a bar C represents an area of an FPGA 1a constituted by the basic tiles 10a each including an MC 100 and an SC 101, to which the first embodiment is applied. In this case, the MC 100 also has eight contexts, and the MCMs $50_{11}$ to $50_{1n}$ and the MCMs $50_{21}$ to $50_{2n}$ each include eight memories $51_1$, $51_2$, ....

In relation to the result in FIG. 17, the MC 100 is estimated to have more than twice as large an area as the SC 101. Thus, when the number of used blocks of the MC 100 is about half of the number of used blocks of the SC 101 as illustrated in FIG. 11, the mounting area will be increased as compared to a normal FPGA owing to the multi-context configuration as indicated by the bar B in FIG. 17. As described above, however, the mounting surface can be reduced as compared to a normal FPGA as indicated by the bar C in FIG. 17 by assigning parts of contexts with larger numbers of used blocks to the SC 101.

As a result of application of the first embodiment in this manner, an FPGA with a smaller area than an FPGA constituted only by normal single-context blocks and than an FPGA constituted only by the multi-context blocks of the related art can be achieved.

Figure 18A:
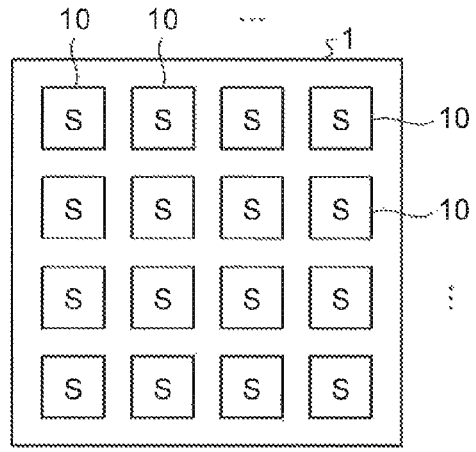
FIGS. 18A to 18C are diagrams illustrating examples of a layout according to an existing technology and a layout according to the first embodiment.
Figure 18B:
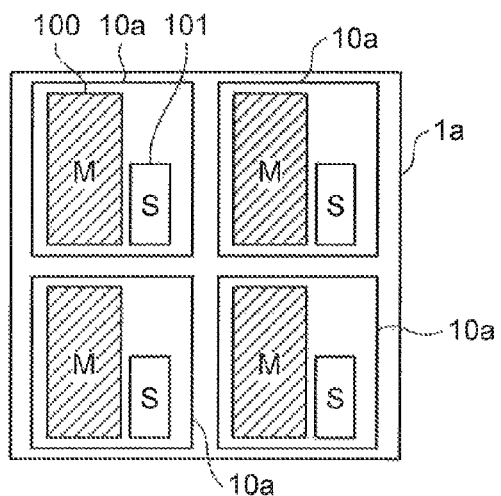
Figure 18C:
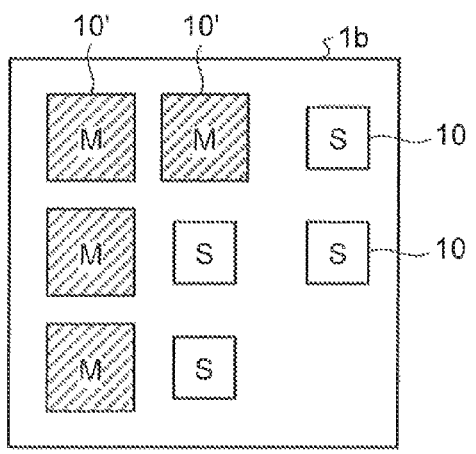

Next, a layout of an MC 100 according to the first embodiment will be described. FIGS. 18A to 18C illustrate examples of a layout according to an existing technology and a layout according to the first embodiment. FIG. 18A corresponds to FIG. 1 described above, and illustrates an example of an FPGA 1 in which basic tiles 10, 10, . . . each including an SC 101 are arranged according to the existing technology. Herein, in the FPGA 1, 16 basic tiles 10 each including one SC 101 (represented by "S" in FIG. 18A) are arranged.

FIG. 18B illustrates an example corresponding to the FPGA 1a illustrated in FIG. 13, in which four basic tiles 10a each including an MC 100 and an SC 101 are arranged according to the first embodiment. Herein, in the FPGA 1a, it is assumed that the MCMs $50_{11}$, $50_{12}$, ..., $50_{1n}$ and the MCMs $50_{21}$, $50_{22}$, ..., and $50_{2n}$ included in the MC 100 are four-context type multi-context blocks each including four memories (M) $51_1$, $51_2$, .... Thus, in the FPGA 1a of FIG. 18B, the MC 100 includes 20 SCs 101 when the numbers of memories in the MCM $50_{11}$, $50_{12}$, ..., and $50_{1n}$ and the MCMs $50_{21}$, $50_{22}$, ..., $50_{2n}$ are simply added and converted to the number of SCs 101.

In FIG. 18B, the basic tile 10a including one or more MCs 100 and one or more SCs 101 is described as being a basic configuration, the configuration is not limited to this example. For example, as illustrated in FIG. 18C, four basic tiles 10 each including an SC 101 and four basic tiles 10' each including an MC 100 may be arranged in combination to constitute an FPGA 1b. In this case, similarly to FIG. 18B, 20 SCs 101 are included according to simple conversion. Furthermore, the number of MCs 100 and the number of SCs 101 included in one FPGA need not be equal. Furthermore, one basic tile 10a is described above as including one MC 100 and one SC 101, the basic tile is not limited thereto, and the numbers of the MCs 100 and SCs 101 included in a basic tile need not be equal.

Figure 19:
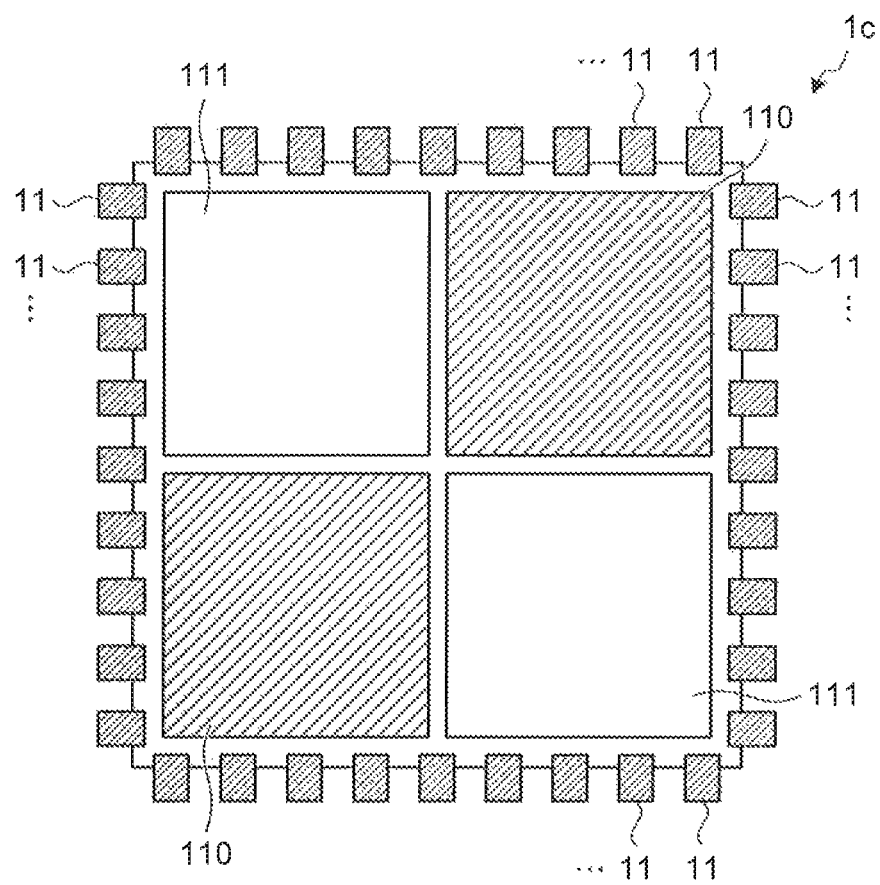
FIG. 19 is a diagram illustrating an example of an FPGA in which first and second regions are arranged in a checkered pattern according to the first embodiment.

Furthermore, a first region including MCs 100 and a second region including SCs 101 may be formed, for example. FIG. 19 illustrates an example of an FPGA 1c in which the first and second regions are arranged in a checkered pattern according to the first embodiment. Specifically, in the example of FIG. 19, in the FPGA 1c, the first region 110 and the second region 111 are repeated alternately in the horizontal direction and in the vertical direction.

The configuration in the checkered pattern illustrated in FIG. 19 is advantageous in that, when all the circuits can have multi-context configurations or when all the circuits have to be used as single-context circuits, for example, critical path delays are short since the distances between blocks are shorter than those in a case where the MCs 100 and the SCs 101 are arranged in combination.

Figure 20:
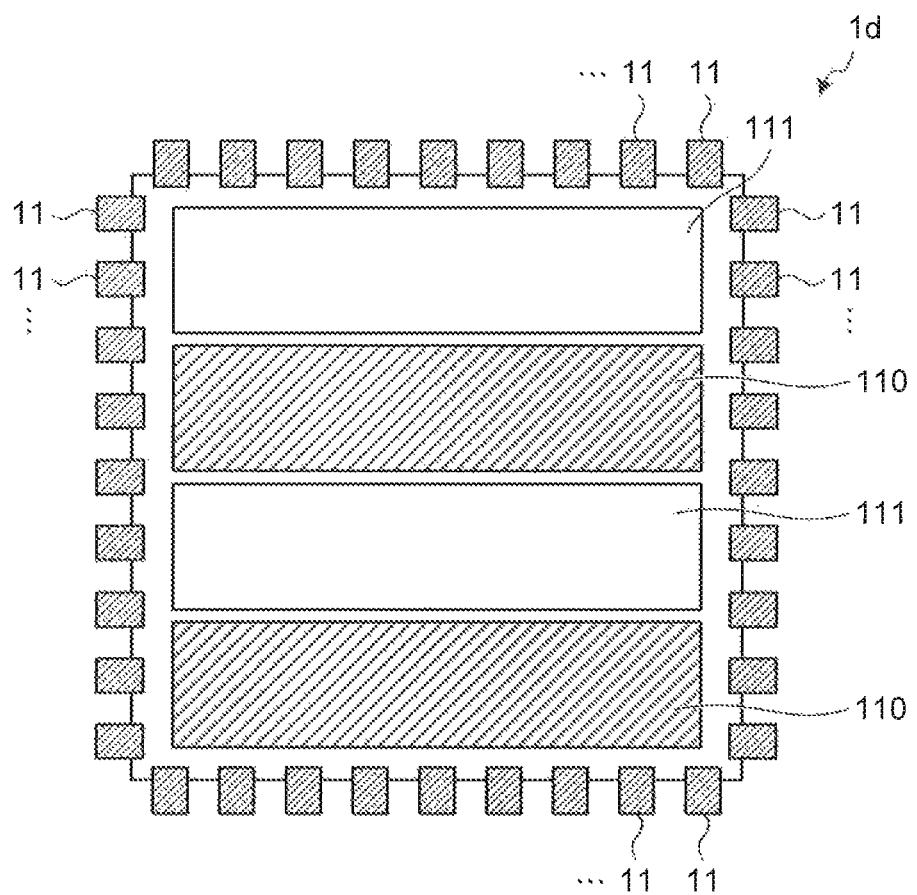
FIG. 20 is a diagram illustrating an example of an FPGA in which first and second regions are arranged alternately in stripes according to the first embodiment.

Furthermore, FIG. 20 illustrates an example of an FPGA 1d in which the first regions 110 and the second regions 111 are arranged alternately in stripes. Specifically, in the example of FIG. 20, the FPGA 1d is constituted by first regions 110 and second regions 111 arranged in stripes in such a manner that the first regions 110 are not adjacent to each other and that the second regions 111 are not adjacent to each other.

The arrangement in stripes illustrated in FIG. 20 is advantageous in that decoder circuits for writing into the memories can be easily built up and in that control of the MCMs 50 can be easily performed since the same type of memories of the memories 30 and the MCMs 50 are arranged in the horizontal direction in FIG. 20, for example.

Needless to say, in FIGS. 19 and 20, the proportions of the first regions 110 in the FPGA 1c and the second regions in the FPGA 1d are not fixed.

Second Embodiment

Next, a second embodiment will be described. In the second embodiment, an appropriate layout of the memories (M) $30_{11}$ to $30_{1n}$ and the memories (M) $30_{21}$ to $30_{2n}$ (see FIG. 2), and the MCMs $50_{11}$ to $50_{1n}$ and the MCMs $50_{21}$ to $50_{2n}$ (see FIG. 6, etc.) in a case where MCs 100 and SCs 101 are combined on one multi-context dynamically reconfigurable FPGA will be provided.

Figure 21:
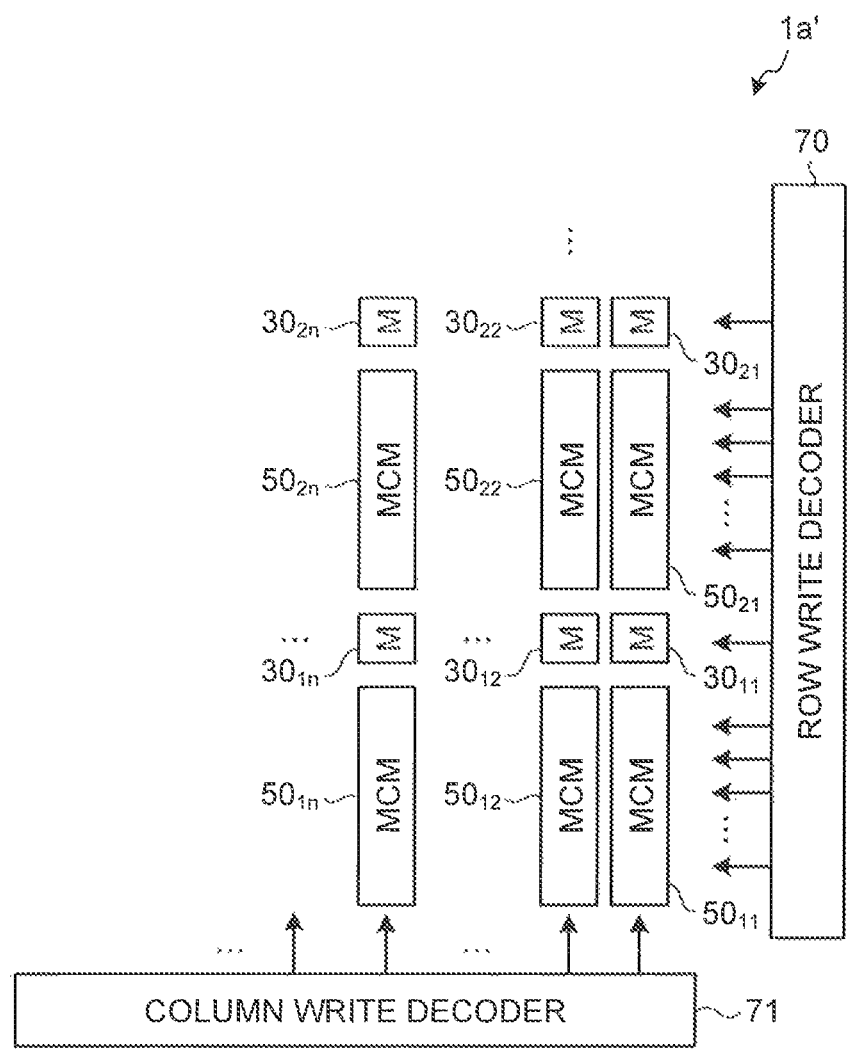
FIG. 21 is a diagram illustrating an example of an FPGA according to a second embodiment.

In FIG. 21, the vertical direction will be referred to as a column and the horizontal direction will be referred to as a row. In an FPGA 1a', for example, in each of the basic tiles 10a each including one MC 100 and one SC 101, the MCMs $50_{11}$, $50_{12}$, . . . , and $50_{1n}$ and the memories (M) $30_{11}$, $30_{12}$, . . . , and $30_{1n}$ connected to the corresponding SB 20 and the MCMs $50_{21}$, $50_{22}$, . . . , and $50_{2n}$ and the memories (M) $30_{21}$, $30_{22}$, . . . , and $30_{2n}$ connected to the corresponding LB 21 are arranged along the direction of the columns.

Figure 22:
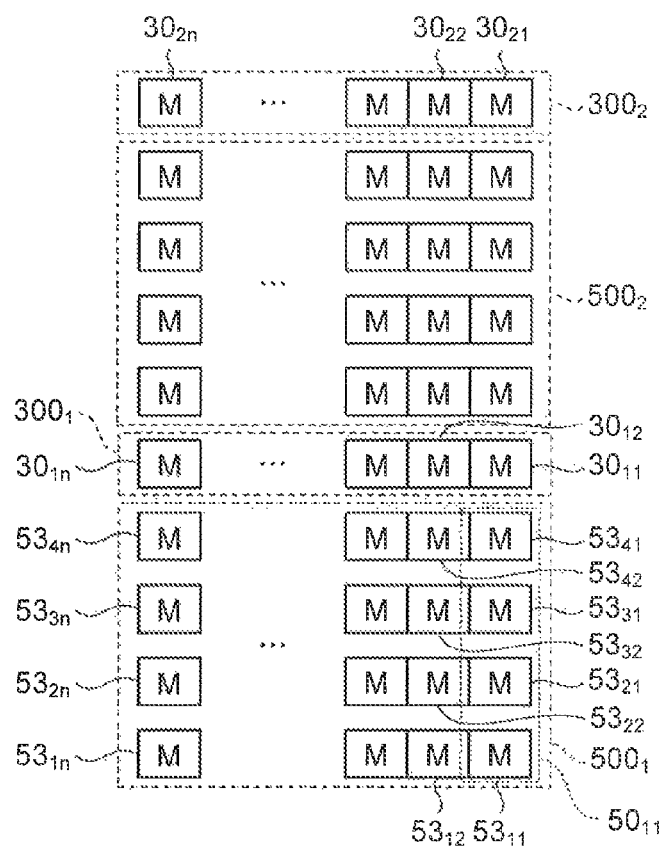
FIG. 22 is a diagram illustrating a memory arrangement of the FPGA according to the second embodiment in more detail.

FIG. 22 illustrates a memory arrangement of the FPGA $1a'$ according to the second embodiment in more detail. In the following, the storages (M) $53_{11}$ to $53_{4n}$ included in each of the MCMs $50_{11}$ to $50_{1n}$ and similar configurations included in the MCMs $50_{21}$ to $50_{2n}$ and the like will be referred to as storages M where appropriate. Similarly, the memories (M) $30_{11}$ to $30_{1n}$ and similar configurations such as the memories (M) $30_{21}$ to $30_{2n}$ will be referred to as memories M where appropriate. Furthermore, in FIG. 22, switches connected to the storages (M) are not illustrated.

As illustrated in FIG. 22, the storages (M) $53_{11}$, $53_{21}$, $53_{31}$, and $53_{41}$ which are included in the MCM $50_{11}$ in the MCMB $500_1$ and to which wires for the selection signals $Q_1$ to $Q_4$ are connected via the switches, and the memory (M) $30_{11}$ included in the SCMB $300_1$ are arranged and placed in the column direction. Similarly, in the MCMB $500_2$ and the SCMB $300_2$, the storages (M) which are included in one MCM (MCM $50_{21}$, for example) in the MCMB $500_2$ and to which wires for the selection signals $Q_1$ to $Q_4$ are connected via the switches, and the memory $30_{21}$ included in the SCMB $300_2$ are arranged and placed in the column direction. The storages (M) and the memory (M) arranged and placed on one column constitute a memory column.

As for the other MCMs $50_{12}$ to $50_{1n}$ included in the MCMB $500_1$ and the other memories (M) $30_{12}$ to $30_{1n}$ included in the SCMB $300_1$, and the other MCMs $50_{22}$ to $50_{2n}$ included in the MCMB $500_2$ and the other memories (M) $M30_{22}$ to $30_{2n}$ included in the SCMB $300_2$, the storages (M) to which wires for different selection signals $Q_n$ are connected via the switches and the memory M constituting a single-context memory included in the MCM are similarly arranged and placed in the direction of the columns.

In the second embodiment, as described above, in MCMs $50_{11}$, $50_{12}$, ..., and $50_{1n}$ connected to the SB 20, for example, in an MC 100 of a basic tile 10a, the storages (M) (with reference to FIG. 9, the storages (M) $53_{11}$, $53_{21}$, $53_{31}$, and $53_{41}$ in the case of the MCM $50_{11}$) to which wires for different selection signals $Q_n$ are connected via the switches are arranged and placed on one column. On this column, similarly in MCMs $50_{21}$, $50_{22}$, ..., and $50_{2n}$ connected to the LB 21, the storages units (M) to which wires for different selection signals $Q_n$ are connected via the switches are further arranged and placed.

Furthermore, on the same column as above, one of memories (M) $30_{11}$, $30_{12}$, ..., and $30_{1n}$ connected to the SB 20 in the SC 101 of this basic tile 10a is placed, and one of the memories (M) $30_{21}$, $30_{22}$, ..., and $30_{2n}$ connected to the LB 21 is placed, for example.

In addition, in MCMs $50_{11}$, $50_{12}$, ..., $50_{1n}$ connected to the SB 20, for example, the storages (M) to which a wire for the same selection signal $Q_n$ is connected via the switches are arranged and placed on one row. In the example of FIG. 9, the storages (M) $53_{11}$, $53_{12}$, ..., and $53_{1n}$ to which a wire for the selection signal $Q_1$ is connected via the switches are place on one row. Note that the memories (M) $30_{11}$, $30_{12}$, ..., and $30_{1n}$ and the memories (M) $30_{21}$, $30_{22}$, ..., and $30_{2n}$ are placed on one row. The storages (M) and the memories (M) arranged and placed on one row constitute a memory row.

In this manner, the storages (M) and the memories (M) form memory rows and memory columns. Similarly for MCs 100 in other basic tiles 10a, the storages (M) and the memories (M) are arranged and placed in columns and in rows to form memory rows and memory columns of storages (M) and memories (M).

Arrangement and placement of the storages (M) and the memories (M) in this manner in columns and in rows according to the wires for the selection signals $Q_n$ can increase the area efficiency of an FPGA.

The description refers back to FIG. 21, in which the FPGA typically includes write decoders for writing data into configuration memories. In the example of FIG. 21, the FPGA $1a'$ includes the row write decoder 70 and the column write decoder 71. The row write decoder 70 and the column write decoder 71 selects a row and a column to write data to, from the columns and the rows on which the storages (M) and the memories (M) are arranged and placed, according to an instruction from outside of the FPGA $1a'$.

The column write decoder 71 writes data into a storage (M) or a memory (M) selected in common by the column write decoder 71 and the row write decoder 70. For example, the column write decoder 71 writes data into a storage (M) or a memory (M) on a column selected by the row write decoder 70 out of the storages (M) or the memories (M) placed on the selected row.

More specifically, in an example in FIG. 22, the row write decoder 70 is assumed to have selected a row including a storage (M) $53_{41}$, for example. In the example of FIG. 22, storages (M) $53_{41}$, $53_{42}$, ..., and $53_{4n}$ are placed on a selected row. In this state, the column write decoder 71 is assumed to have selected a column including a storage (M) $53_{11}$ and a column including a storage (M) $53_{12}$. In this case, the storages (M) $53_{41}$ and $53_{42}$ are selected in common by the row write decoder 70 and the column write decoder 71, and the column write decoder 71 can write data into the storages (M) $53_{41}$ and $53_{42}$.

As described above, according to the second embodiment, since the storages (M) and the memories (M) of a basic tile 10a are arranged and placed in columns and in rows, data writing into the storages (M) and the memories (M) can be easily performed by the row write decoder 70 and the column write decoder 71.

Third Embodiment

Next, a third embodiment will be described. The third embodiment is an example in which the FPGA $1'$, the FPGA $1a$, the FPGA $1a'$, the FPGA $1b$, the FPGA $1c$, and the FPGA $1d$ according to the first and second embodiments described above are applied to an electronic device.

Figure 23:
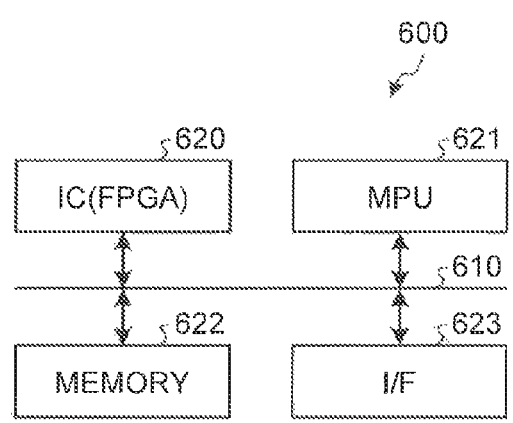
FIG. 23 is a block diagram illustrating an example of an electronic device according to a third embodiment.

FIG. 23 illustrates an example of an electronic device according to the third embodiment. In FIG. 23, an electronic device 600 includes an integrated circuit (IC) 620, a microprocessing unit (MPU) 621, a memory 622, and an interface (I/F) 623 with respect to a bus 610.

The IC 620 is each of the FPGAs according to the first and second embodiments described above. Herein, the IC 620 is assumed to be the FPGA $1a'$. As described with reference to FIGS. 13 and 14, the FPGA $1a'$ includes basic tiles 10a, 10a, ... each including an MC 100 and an SC 101, and includes I/Os 11, 11, ... configured to pass and receive data to and from the outside. The FPGA $1a'$ also includes a row write decoder 70 and a column write decoder 71 as illustrated in FIG. 21.

The MPU 621 operates according to a program. The memory 622 stores in advance programs according to which the MPU 621 operates. The memory 622 is also used as a work memory for operation of the MPU 621. The interface 623 communicates with external devices under control of the MPU 621.

In the IC 620, data are written into memories included in the MCs 100 and the SCs 101 in the basic tiles 10a, that is, into the memories (M) $30_{11}$ to $30_{1n}$ and the memories (M) $30_{21}$ to $30_{2n}$, and the storages (M) $53_{11}$ to $53_{4n}$ of the MCMs $50_{11}$ to $50_{1n}$ and the MCMs $50_{21}$ to $50_{2n}$ before product shipment or before being used by a user, for example. Data to be written and a write instruction are supplied to the FPGA 1a' from an external device, for example. In the FPGA 1a', the row write decoder 70 and the column write decoder 71 sequentially write the data to be written into the memories in the basic tiles 10a according to the write instruction.

When a computation process is required in the IC 620 according to a program being executed, for example, the MPU 621 transfers a command and data to the IC 620 via the bus 610, and causes the IC 620 to perform the computation process. The result of computation from the IC 620 is transferred to the MPU 621 via the bus 610. The MPU 621 outputs a result of program execution or the like to the outside via the interface 623, for example.

In the electronic device 600 according to the third embodiment, the FPGA has a smaller area and the IC 620 can be made smaller as described above, which enables the housing size to be reduced and facilitates wiring.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described, herein may be made without departing from the spirit of the inventions. The accompanying claims and their equivalents are intended to cover such forms or modifications as would fall within the scope and spirit of the inventions.

What is claimed is:

1. A reconfigurable semiconductor integrated circuit comprising a first block and a second block, wherein
the first block includes:
first memories that store therein a plurality of values;
second memories that store therein a plurality of values;
a first logic circuit whose logic is determined according to data selected with a selection signal from the first memories; and
a first switch circuit that is connected to first wires through which data are transmitted and switches connection between the first wires according to data read from the memory selected by the selector from the second memories, a part of the first wires being connected to the first logic circuit, and
the second block includes:
a third memory that stores therein a single value;
a fourth memory that stores therein a single value;
a second logic circuit whose logic is determined according to data read from the third memory; and
a second switch circuit that is connected to second wires through which data are transmitted and switches connection between the second wires according to data read from the fourth memory, a part of the second wires being connected to the second logic circuit.

2. The circuit according to claim 1, wherein
the circuit includes one or more tiles, and
one or more first blocks and one or more second blocks are arranged in each of the tiles.

3. The circuit according to claim 2, wherein the tiles and at least one of the first block and the second block are arranged in combination.

4. The circuit according to claim 1, wherein the circuit includes a first region including first blocks and a second region including second blocks.

5. The circuit according to claim 4, wherein the first region and the second region are repeated alternately in a first direction and in a second direction crossing the first direction.

6. The circuit according to claim 4, wherein the first region and the second region are arranged in strips.

7. An electronic device comprising:
the reconfigurable semiconductor integrated circuit according to claim 1;
a storage that stores therein a program; and
a processor that causes the reconfigurable semiconductor integrated circuit to perform a predetermined process according to the program stored in the storage.

8. The circuit according to claim 1,
wherein
a plurality of first memory groups each include the first memories, the second memories, the third memory, and the fourth memory that are arranged in a first direction, and
the plurality of the first memory groups are arranged in a second direction crossing the first direction.

9. The circuit according to claim 8, further comprising a writing circuit that writes data into the first memories, the second memories, the third memory and the fourth memory, wherein
the writing circuit that:
selects a sequence of memories arranged in the first direction from the memories included in the first memory groups and selects a sequence of memories arranged in the second direction from the memories included in the first memory groups; and
writes data into a memory commonly selected in both of the first direction and the second direction.

10. The circuit according to claim 1, wherein
the first block is a multi-context block, and
the second block is a single-context block.

11. The circuit according to claim 10, wherein
the first memories and the second memories are multi-context memories that are connected in parallel.

12. A reconfigurable semiconductor integrated circuit comprising a first block and a second block, wherein
the first block includes:
a first logic circuit;
a first switch circuit;
first memories; and
second memories;
the first logic circuit includes a plurality of first memory input terminals;
for the first logic circuit, a logic is determined according to a memory signal that is input to a corresponding first memory input terminal in the plurality of the first memory input terminals;
for the first memories, read data is input to the plurality of the first memory input terminals;
the first switch circuit has a plurality of second memory input terminals;
the first switch circuit switches connection through which data is input or output with respect to the first logic circuit according to a memory signal that is input to a corresponding second memory input terminal in the plurality of the second memory input terminals; and
for the second memories, read data is input to the plurality of the second memory input terminals, and
the second block includes:
a first memory block;
a second memory block;
a selector;

a second logic circuit; and a second switch circuit;

the first memory block includes two or more memories each having a same circuit configuration as that of a first memory and has a plurality of first output lines to which outputs from the two or more memories are connected;

the second memory block includes two or more memories each having a same circuit configuration as that of a second memory and has a plurality of second output lines to which outputs from the two or more memories are connected;

the selector selects one of the first memories and one of the second memories;

for the second logic circuit, a logic is determined according to read data, the read data being obtained by connecting the plurality of the first output lines of the first memory block to third memory input terminals and by reading from a memory that is selected from the first memory block by the selector; and the second switch circuit switches connection through which data is input or output with respect to the second logic circuit according to read data, the read data being obtained by connecting the plurality of the second output lines of the second memory block to fourth memory input terminals and by reading from a memory that is selected from the second memory block by the selector.

* * * * *